(12) United States Patent
Hao

(10) Patent No.: US 6,528,949 B2
(45) Date of Patent: Mar. 4, 2003

(54) APPARATUS FOR ELIMINATION OF PLASMA LIGHTING INSIDE A GAS LINE IN A STRONG RF FIELD

(75) Inventor: Fangli J. Hao, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 125 days.

(21) Appl. No.: 09/820,751

(22) Filed: Mar. 30, 2001

(65) Prior Publication Data

US 2002/0140358 A1 Oct. 3, 2002

(51) Int. Cl.$^7$ .................................................. H01J 7/24
(52) U.S. Cl. ............................. 315/111.71; 315/111.21; 315/111.51; 315/111.81; 156/345
(58) Field of Search ..................... 315/111.21, 111.51, 315/111.71, 111.81; 156/345, 643; 118/723 I, 723 AN; 219/121.48

(56) References Cited

U.S. PATENT DOCUMENTS

| | | | | |
|---|---|---|---|---|
| 3,903,891 A | * | 9/1975 | Brayshaw | 128/303.14 |
| 4,948,458 A | | 8/1990 | Ogle | 156/643 |
| 5,558,736 A | * | 9/1996 | Lee et al. | 156/345 |
| 5,759,280 A | | 6/1998 | Holland et al. | 118/723 I |
| 6,229,264 B1 | * | 5/2001 | Ni et al. | 315/111.51 |

* cited by examiner

*Primary Examiner*—Don Wong
*Assistant Examiner*—Jimmy T. Vu
(74) *Attorney, Agent, or Firm*—Lowe Hauptman Gilman & Berner, LLP

(57) ABSTRACT

The present invention is directed to a plasma processor, and more specifically, to an apparatus to reduce or eliminate plasma lighting inside a gas line in a strong RF field in the plasma processor. More particularly, the present invention uses shielding and gas flow restricting to reduce or eliminate plasma lighting in a gas line used to deliver gas to cool the work piece in the plasma processor.

20 Claims, 6 Drawing Sheets

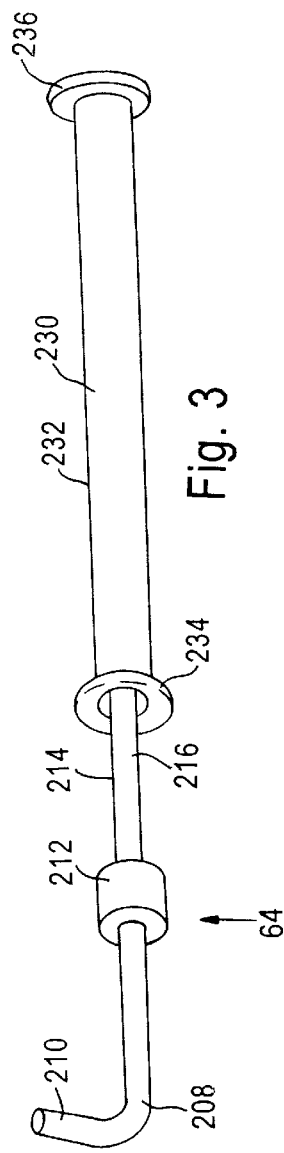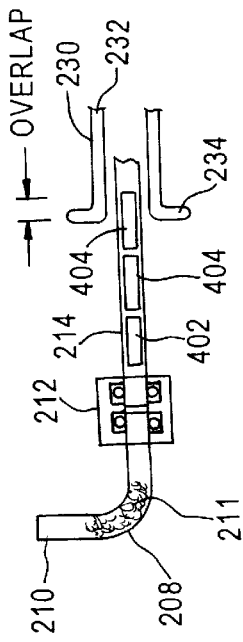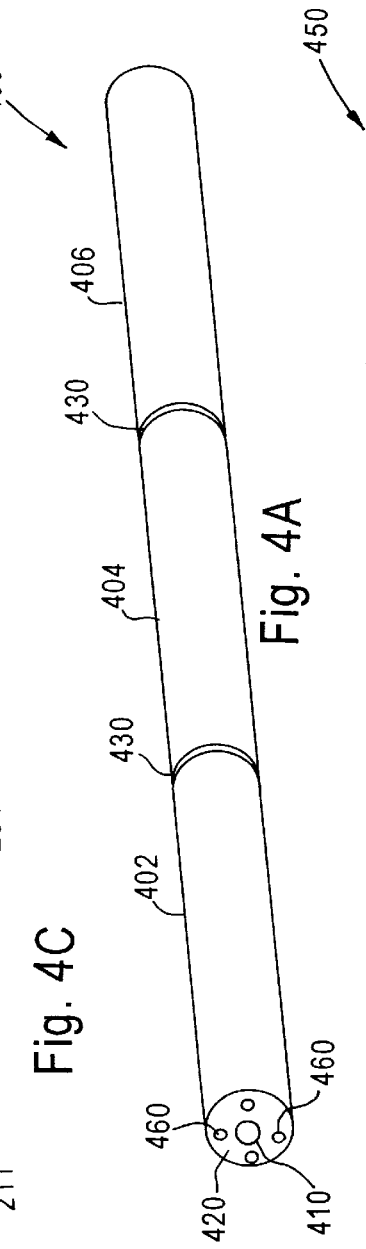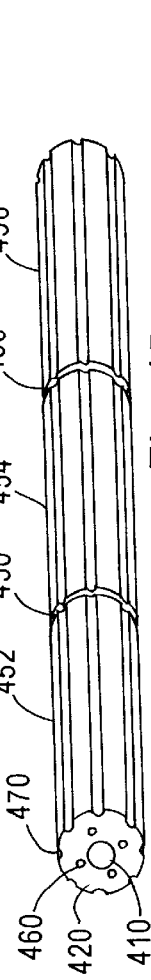

APPARATUS FOR ELIMINATION OF PLASMA LIGHTING INSIDE A GAS LINE IN A STRONG RF FIELD

FIELD OF THE INVENTION

The present invention is directed to a plasma processor, and more specifically, to an apparatus to reduce or eliminate plasma lighting inside a gas line in a strong RF field in the plasma processor. More particularly, the present invention uses RF shielding and gas flow restricting to reduce or eliminate plasma lighting in a gas line used to deliver gas to cool the work piece in the plasma processor.

BACKGROUND OF THE INVENTION

Vacuum processors for processing a work piece (i.e., etching materials from or depositing materials onto the work piece) typically include first and second ports respectively connected to a vacuum pump and one or more sources of ionizable gas. The gas is excited to a plasma in the chamber by an electrical source including a reactance responsive to a first AC source, typically an RF or microwave source. A first matching network is usually connected between the first AC source and the reactance for exciting the plasma. If the source is an RF source, the reactance is either a coil for supplying magnetic and electric fields to the chamber interior via a dielectric window or a parallel plate capacitive arrangement for supplying an electric field to the chamber interior.

The work piece, which is typically a semiconductor wafer or a dielectric sheet or a metal plate, is clamped in place on a work piece holder, i.e., chuck, that frequently includes an electrode covered by a dielectric. DC voltage is typically applied to the electrode to provide an electrostatic clamping force to hold the work piece in situ on the holder. The work piece is usually cooled by applying a coolant agent, such as helium, to a recess in the chuck. To accelerate ions in the plasma to the work piece, a second AC source is connected to the electrode by way of a matching network. Each matching network includes a pair of variable reactances having values that are varied by motors, typically step motors.

Sensors for electric parameters associated with the plasma, as coupled to the excitation reactance and as coupled to the chuck electrode, derive signals which assist in controlling the values of the variable reactances. Pressure and flow rate transducers respectively in the chamber and in a line supplying gas to the second port derive signals which assist in controlling the vacuum pressure in the chamber and the flow rate of gas flowing into the chamber through the second port.

A controller including a microprocessor and a memory system including a hard drive, random access memory (RAM) and a read only memory (ROM), responds to the signals derived by the transducers and signals from an operator input console to produce signals for controlling the variable reactances, output power of the two AC sources, the vacuum pressure in the chamber and the flow rate of gases supplied to the chamber through the second port. The memory system stores several recipes, each in the form of signals representing various parameters controlling the deposition and etching of the work pieces for differing situations. The parameters of each recipe are, inter alia, gas species to be supplied to the chamber, flow rates of the species, vacuum pressure in the chamber and output powers of the two AC sources. Each recipe can include other parameters, such as a time for carrying out each recipe and/or the thickness of the layer being deposited. The controller responds to the parameters of the recipe to control valves for the flow of the gases into the chamber, the chamber pressure, as well as the output power of the first and second AC sources. During processing, the controller controls the reactances of the first and second matching networks so that there is an efficient transfer of power between the first and second AC sources and the loads they drive so the impedances seen looking into the output terminals of the first and second sources are substantially equal to the impedances the first and second sources respectively seen by looking from their output terminals into cables connected to the first and second matching networks.

The gas line used to deliver the cooling agent, such as helium gas, is exposed to the RF source. One problem that occurs is that the helium gas exposed in the gas line to the strong RF field can become plasma in the gas line, a phenomenon called plasma lighting. Plasma can enter the vacuum chamber causing damage to the vacuum processing system and the work piece. Also, the plasma can melt the gas line thereby damaging the vacuum system and the work piece.

To reduce plasma lighting in the helium gas line, a conventional plasma arrestor can be used. A plasma arrestor is typically a one to one and a half-inch long ceramic insert which is inserted adjacent to the RF hot junction. For 200–300 mm diameter work pieces due to the strong RF field, higher cooling requirement for 200–300 mm diameter work pieces requires high gas pressure and irregular geometry for the gas line and the conventional plasma arrestor does not work and plasma lighting occurs in the gas line. Thus, a need exists for an apparatus which can reduce or eliminate plasma lighting in a strong RF field.

SUMMARY OF THE INVENTION

The present invention is directed to a plasma processor, and more specifically, to an apparatus to reduce or eliminate plasma lighting inside a gas line in a strong RF field in the plasma processor. More particularly, the present invention uses shielding and gas flow restricting to reduce or eliminate plasma lighting in a gas line used to cool the work piece in the plasma processor.

Without shielding and a gas flow restrictor plasma light can occur in the gas line used to cool the work piece. Helium is the typical gas used to cool the work piece. As used in the present invention, shielding is a partition or box for blocking an electric field from entering the space within the shield. Shielding is accomplished in the present invention by using a metal enclosure called an RF shield to surround a portion of the gas line. RF current flows on the surface of the enclosure, but does not penetrate the interior. The thickness of the RF shield is greater than the skin depth to prevent the RF field from penetrating the RF shield. However, portions of the gas line cannot be surrounded by the RF shield because portions of the gas line are connected to elements that are RF hot.

To prevent RF lighting in an exposed portion of the gas line, a flow restrictor is installed therein to increase the breakdown voltage of the gas flowing in the gas line. The interface and/or overlap of RF hot and ground are to be determined by space limitations, the strength of the field, and other factors. A corona ring is applied at sharp points/edges of the metal enclosure to reduce the voltage gradient to reduce the possibility of plasma lighting and arcing. The corona shield also reduces the voltage gradient and shields specific areas from the electric field.

In accordance with the teachings of the present invention, a plasma processor having a gas line used for cooling a work piece is provided with an RF shield and a gas flow restrictor which prevents or eliminates plasma light in the gas line.

The vacuum processor for processing a work piece according to the present invention includes a vacuum plasma processing chamber, a coil responsive to an RF source for exciting the gas to a plasma capable of processing the plasma on a holder, a gas line connected to the chamber, an RF shield surrounding a portion of the gas line, and a flow restrictor inside an unshielded portion of the gas line.

According to an aspect of the present invention, the thickness of the RF shield is greater than the skin depth to prevent the RF field from penetrating the RF shield.

According to another aspect of the invention, the gas flow restrictor having the geometry used in the present invention has small diameter flow paths which have higher breakdown voltages than larger diameter flow paths for the gas flowing in the gas line, according to the Patchen curve.

Another aspect of the present invention is a bendable flow restrictor positioned in a bent portion of the gas line which includes stiff insulate material such as a ceramic insert and insulate wool.

Another aspect of the invention includes multiple inserts to form a flow restrictor which resolves the problem of manufacturing long inserts and also reduces the feature size.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 3 is a perspective view of a gas line with a shield according to the present invention;

FIG. 4A is a perspective view of a first embodiment of a gas flow restrictor according to the present invention;

FIG. 4B is a perspective view of a second embodiment of a gas flow restrictor according to the present invention;

FIG. 4C is a schematic cross-sectional view of the flow restrictor and the RF shield according to the present invention;

BEST MODE FOR CARRYING OUT THE INVENTION

Figure 1:
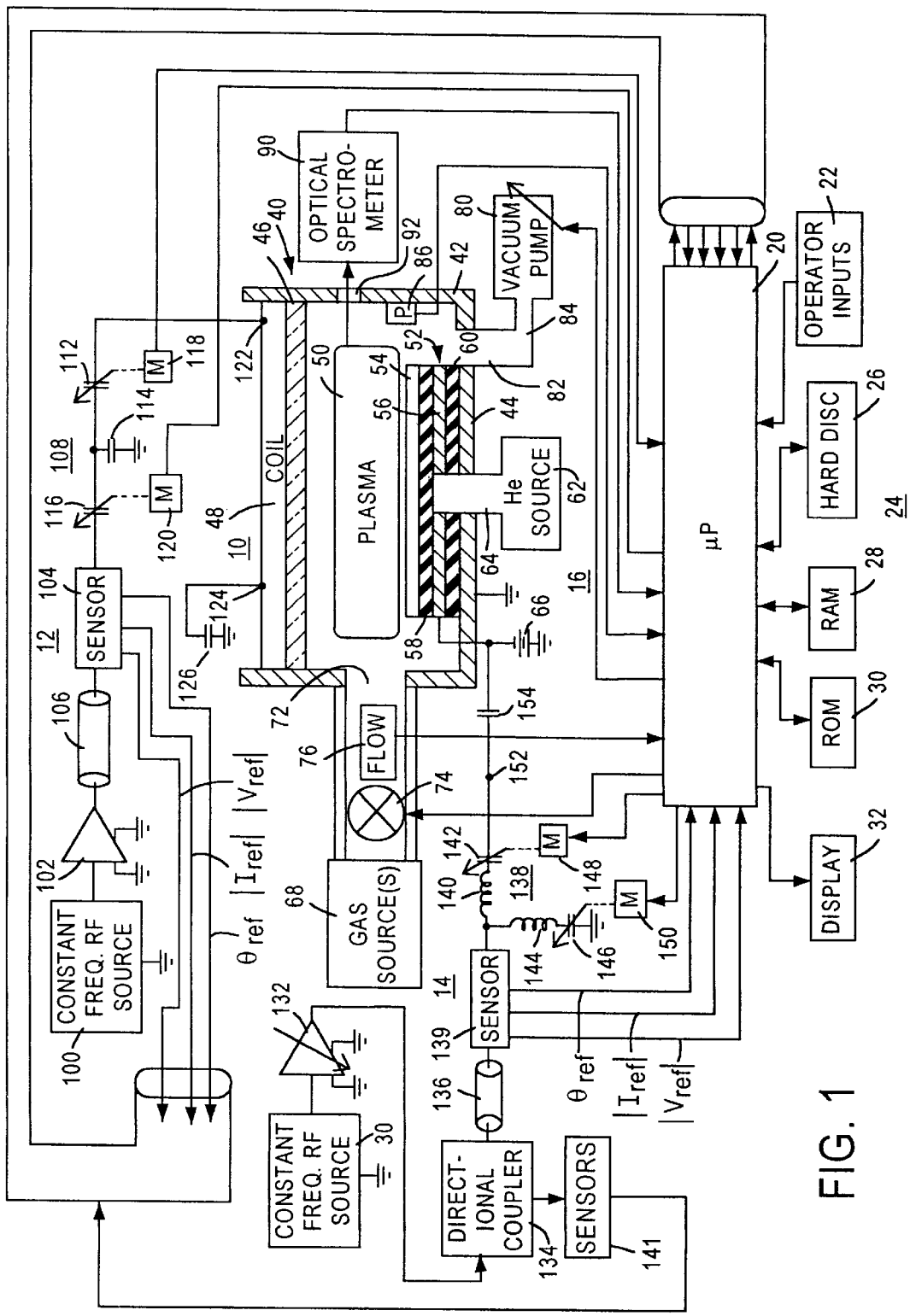
FIG. 1 is a schematic diagram of a plasma processor.

The work piece processor illustrated in FIG. 1 includes vacuum plasma processing chamber assembly 10, a first circuit 12 for driving a reactance for exciting ionizable gas in chamber assembly 10 to a plasma state, a second circuit 14 for applying RF bias to a work piece holder in chamber assembly 10, and a controller arrangement 16 responsive to sensors for various parameters associated with chamber assembly 10 for deriving control signals for devices affecting the plasma in chamber assembly 10.

Controller 16 includes microprocessor 20 which responds to various sensors associated with chamber assembly 10, as well as circuits 12 and 14, and signals from operator input 22, which can be in the form, for example, of a keyboard. Microprocessor 20 is coupled with memory system 24 includes hard disk 26, RAM 28 and ROM 30. Microprocessor 20 responds to the various signals supplied to it to drive display 32, which can be a typical computer monitor.

Hard disk 26 and ROM 30 store programs for controlling the operation of microprocessor 20 and preset data associated with different recipes for the processes performed in chamber assembly 10. The different recipes concern gas species and flow rates applied to chamber assembly 10 during different processes, the output power of AC sources included in circuits 12 and 14, the vacuum applied to the interior of chamber assembly 10 and initial values of variable reactances included in matching networks of circuits 12 and 14.

Plasma chamber assembly 10 includes chamber 40 having metal, non-magnetic cylindrical side wall 42 and metal non-magnetic base 44, both of which are electrically grounded. Dielectric, typically quartz, window 46 is fixedly positioned in the top edge of wall 42. Wall 42, base 44 and window 46 are rigidly connected to each other by suitable gaskets to enable a vacuum to be established within the interior of chamber 40. Planar plasma excitation coil 48, for example, as configured in Ogle, U.S. Pat. No. 4,948,458 or Holland et al., U.S. Pat. No. 5,759,280 sits on or in very close proximity to the upper face of window 46. Coil 46, an electric reactance, reactively supplies magnetic and electric RF fields to the interior of chamber 40 to excite ionizable gas in the chamber to plasma, schematically illustrated in FIG. 1 by reference numeral 50.

The upper face of base 44 carries holder 52 for work piece 54, which is typically a circular semiconductor wafer, a rectangular dielectric plate such as used in flat panel displays or a metal plate. Work piece holder 52 typically includes metal plate electrode 56 which carries dielectric layer 58 and sits on dielectric layer 60, which is carried by the upper face of base 44. A work piece handling mechanism (not shown) places work piece 54 on the upper face of dielectric layer 58. Work piece 54 is cooled by supplying helium from a suitable source 62 to the underside of dielectric layer 58 via conduit 64 and grooves (not shown) in electrode 56. With work piece 54 in place on dielectric layer 58, DC source 66 supplies a suitable voltage through a switch (not shown) to electrode 56 to clamp, i.e., chuck, work piece 54 to holder, i.e., chuck 52.

With work piece 54 secured in place on chuck 52, one or more ionizable gases from one or more sources 68 flow into the interior of chamber 40 through conduit 70 and port 72 in sidewall 42. For convenience, only one gas source 68 is included in FIG. 1, but it is to be understood that usually there are several gas sources of different species, e.g., etchants, such as $SF_6$, $CH_4$, $C_{12}$, $HB_r$, dilutents, such as argon and helium and O₂ as a passivation gas. The interior of conduit 70 includes valve 74 and flow rate gauge 76 for respectively controlling the flow rate of gas flowing through port 72 into chamber 40 and measuring the gas flow rate through port 72. Valve 74 responds to a signal microprocessor 20 derives, while gauge 76 supplies the microprocessor with an electric signal indicative of the gas flow rate in conduit 70. Memory system 24 stores for each recipe of each work piece 54 processed in chamber 40 a signal indicative of desired gas flow rate in conduit 70. Microprocessor 20 responds to the signal memory system 24 stores for desired flow rate and the monitored flow rate signal gauge 76 derives to control valve 74 accordingly.

Vacuum pump 80, connected to port 82 in base 44 of chamber 40 by conduit 84, evacuates the interior of the chamber to a suitable pressure, typically in the range of one to one hundred milliTorr. Pressure gauge 86, in the interior of chamber 40, supplies microprocessor 20 with a signal indicative of the vacuum pressure in chamber 40. Memory system 24 stores for each recipe a signal indicative of desired vacuum pressure for the interior of chamber 40. Microprocessor 20 responds to the stored desired pressure signal memory system 24 derives for each recipe and an electric signal from pressure gauge 86 to supply an electric signal to vacuum pump 80 to maintain the pressure in chamber 40 at the set point or predetermined value for each recipe.

Optical spectrometer 90 monitors the optical emission of plasma 50 by responding to optical energy emitted by the plasma and coupled to the spectrometer via window 92 in side wall 42. Spectrometer 90 responds to the optical energy emitted by plasma 50 to supply an electric signal to microprocessor 20. Microprocessor 20 responds to the signal spectrometer 90 derives to detect an end point the process (either etching or deposition) plasma 50 is performing on work piece 54. Microprocessor 20 responds to the signal spectrometer 90 derives and signal memory system 24 stores indicative of a characteristic of the output of the spectrometer associated with an end point to supply the memory with an appropriate signal to indicate that the recipe has been completed. Microprocessor 20 then responds to signals from memory system 24 to stop certain activities associated with the completed recipe and initiate a new recipe on the work piece previously processed in chamber 40 or commands release of work piece 54 from chuck 52 and transfer of a new work piece to the chuck, followed by instigation of another series of processing recipes.

Excitation circuit 12 for driving coil 48 includes constant frequency RF source 100, typically having a frequency of 13.56 MHz. Source 100 drives power amplifier 102. The output power of amplifier 102 is typically in the range between 100 and 3000 watts. Amplifier 102 typically has a 50 ohm output impedance all of which is resistive and none of which is reactive. Hence, the impedance seen looking back into the output terminals of amplifier 102 is typically represented by (50+j0) ohms, and cable 106 is chosen to have a characteristic impedance of 50 ohms.

For any particular recipe, memory system 24 stores a signal for desired output power of amplifier 102. Memory system 24 supplies the desired output power of amplifier 102 to the amplifier by way of microprocessor 20. The output power of amplifier 102 can be controlled in an open loop manner in response to the signals stored in memory system 24 or control of the output power of amplifier 102 can be on a closed loop feedback basis, as known in the art. The output power of amplifier 102 is also dynamically changed as a function of time as changes in recipes are ordered by memory system 24.

The output power of amplifier 102 drives coil 48 via cable 106 and matching network 108. Matching network 108, configured as a "T" includes two series legs including variable capacitors 112 and 116, as well as a shunt leg including fixed capacitor 114. Coil 48 includes input and output terminals 122 and 124, respectively connected to one electrode of capacitor 112 and to a first electrode of series capacitor 126, having a grounded second electrode. The value of capacitor 126 is preferably selected as described in the commonly assigned, previously mentioned, Holland et al. patent. Electric motors 118 and 126, preferably of the step type, respond to signals from microprocessor 20 to control the values of capacitors 112 and 116 in relatively small increments to maintain an impedance match between the impedance seen by looking from the output terminals of amplifier 102 into cable 106 and by looking from cable 106 into the output terminals of amplifier 102. Hence, for the previously described (50+j0) ohm output impedance of amplifier 102 and 50 ohm characteristic impedance of cable 106, microprocessor 20 controls motors 118 and 120 so the impedance seen looking from cable 106 into matching network 108 is as close as possible to (50+j0) ohms.

To control motors 118 and 120 to maintain a matched condition for the impedance seen looking into the output terminals of amplifier 132 and the impedance amplifier 132 drives, microprocessor 20 responds to signals from conventional sensor arrangement 104 indicative of the impedance seen looking from cable 106 into matching network 108. Alternatively, sensors can be provided for deriving signals indicative of the power amplifier 102 supplies to its output terminals and the power reflected by matching network 108 back to cable 106. Microprocessor 20 responds, in one of several known manners, to the sensed signals that sensor arrangement 104 derives to control motors 118 and 120 to attain the matched condition.

Circuit 14 for supplying RF bias to work piece 54 via electrode 56 has a construction somewhat similar to circuit 12. Circuit 14 includes constant frequency RF source 130, typically having a frequency such as 400 kHz, 2.0 mHz or 13.56 mHz. The constant frequency output of source 30 drives variable gain power amplifier 132, which in turn drives a cascaded arrangement including directional coupler 134, cable 136 and matching network 138. Matching network 138 includes a series leg comprising the series combination of fixed inductor 140 and variable capacitor 142, as well as a shunt leg including fixed inductor 144 and variable capacitor 146. Motors 148 and 150, which are preferably step motors, vary the values of capacitors 142 and 146, respectively, in response to signals from microprocessor 20. Output terminal 152 of matching network 138 supplies an RF bias voltage to electrode 56 by way of series coupling capacitor 154 which isolates matching network 138 from the chucking voltage of DC source 66. The RF energy circuit 14 applies to electrode 56 is capacitively coupled via dielectric layer 48, work piece 54 and a plasma sheath between the work piece and plasma to a portion of plasma 50 in close proximity with chuck 52. The RF energy that check 52 couples to plasma 50 establishes a DC bias in the plasma. The DC bias typically has values between 50 and 1000 volts. The DC bias resulting from the RF energy circuit 14 applies to electrode 52 accelerates ions in the plasma 50 to work piece 54.

Microprocessor 20 responds to signals indicative of the impedance seen looking from cable 136 into matching network 138, as derived by a known sensor arrangement 139, to control motors 148 and 150 and the values of capacitors 142 and 146 in a manner similar to that described, supra, with regard go control of capacitors 112 and 116 of matching network 108.

For each process recipe, memory system 24 stores a set point signal for the net power flowing from directional coupler 134 into cable 136. The net power flowing from directional coupler 134 into cable 136 equals the output power of amplifier 132 minus the power reflected from the load and matching network 138 back through cable 136 to the terminals of directional coupler 134 connected to cable 136. Memory system 24 supplies the net power set point signal associated with circuit 14 to microprocessor 20. Microprocessor 34 also responds to output signals directional coupler 134 supplies to power sensor arrangement 141. Power sensor arrangement 141 derives signals indicative of output power of amplifier 132 and power reflected by cable 136 back toward the output terminals of amplifier 132.

Microprocessor 20 responds to the set point and measured signals sensor arrangement 141 derives, which measured signals are indicative of the output power of amplifier 132 and the power reflected back to amplifier to control the gain of amplifier 132.

Figure 2A:
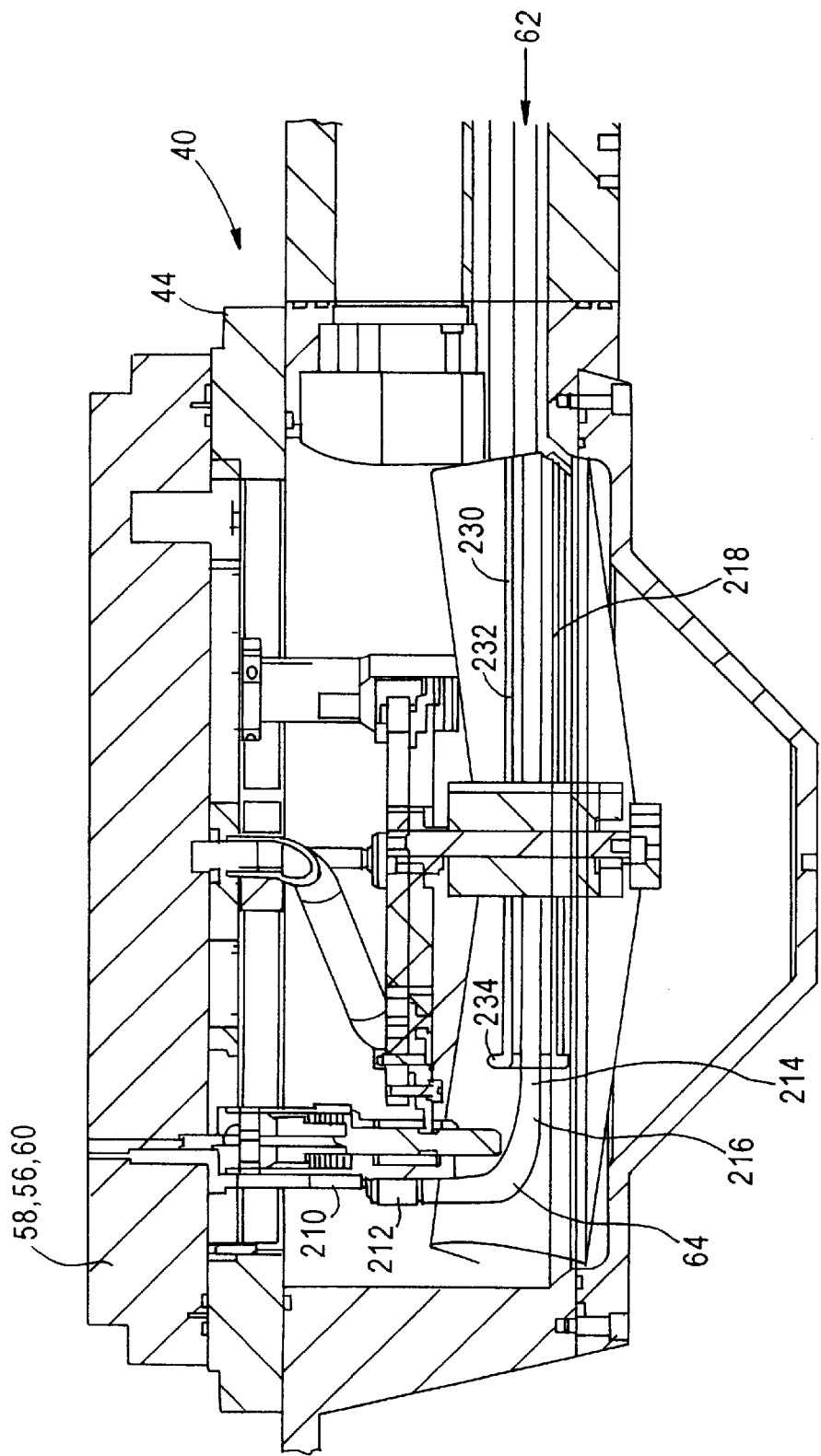
FIG. 2A is a cross-sectional side elevational view of an area below the work piece.
Figure 2B:
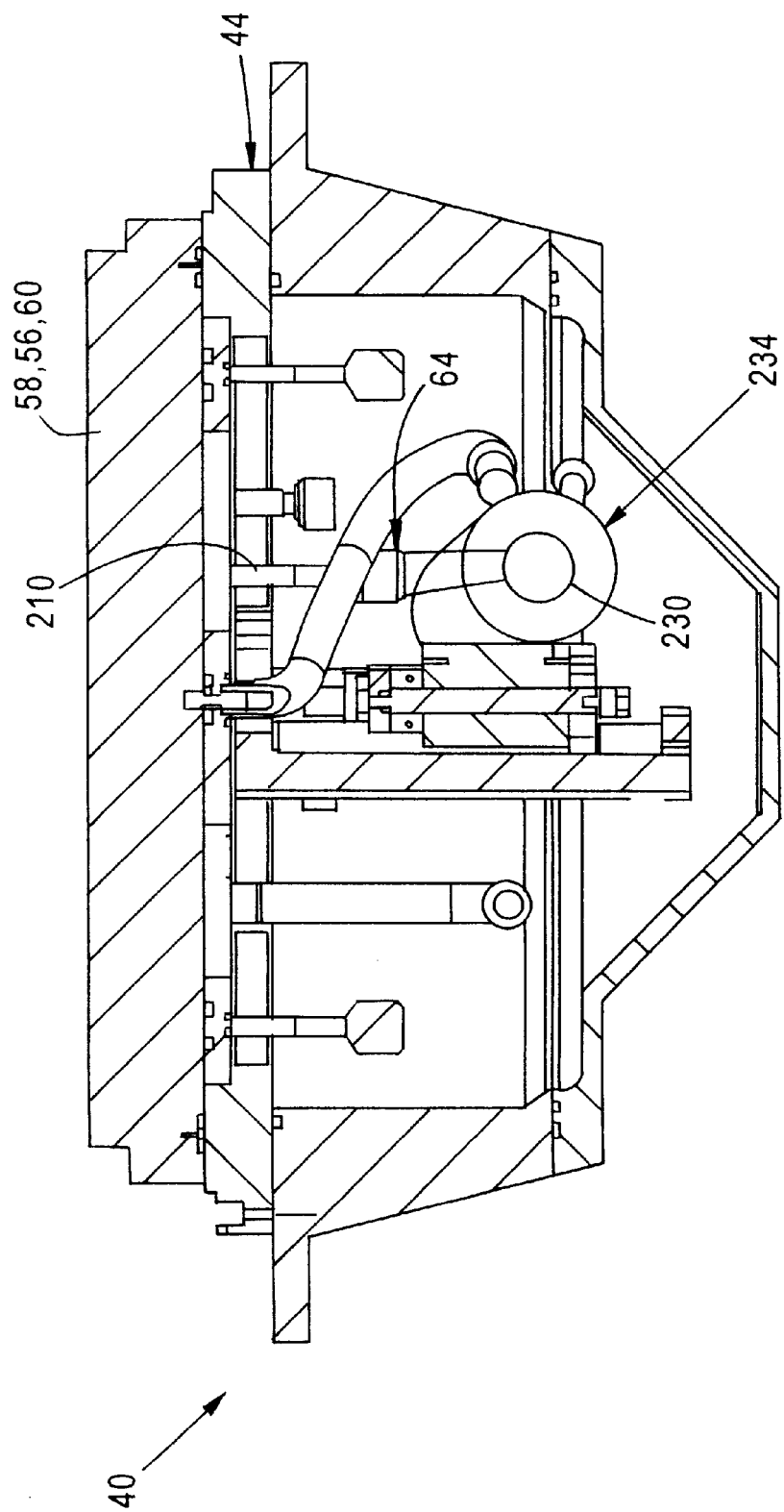
FIG. 2B is another cross-sectional side elevational view of the area below the work piece.

Refer now to FIGS. 2A and 2B wherein the environment which the present invention is used is illustrated. As depicted in FIGS. 2A and 2B, the metal plate electrode 56, the dielectric layer 58 and the dielectric layer 60 are depicted above the base 44. As depicted in FIGS. 2A and 2B, the conduit 64 is connected to the helium source 62. The helium conduit 64 includes a straight metallic portion 210 which extends from the base plate 44 to a RF junction 212. RF junction 212 is RF hot, and is at the same voltage potential as portion 210 because the metallic portion has good conductivity. Portions 212 and 214 are at different voltage potentials because insulator is not electrically conductive. In FIG. 2A, the RF junction 212 is depicted in a vertical orientation and in FIG. 2B is depicted in horizontal orientation. The RF junction 212 provides a sealed junction between the metallic tube portion 210 and the non-metallic tube portion 216 as described below. As depicted in FIGS. 2A and 2B, a bent portion 216 of the helium tube 64 extends downwardly from the RF hot portion 212 into a straight portion 214. The portions 214 and 216 are of an electrically non-conductive material such as Teflon™. A RF shield 230 according to the present invention includes a straight portion 232 and at least one corona ring 234 located at an end thereof.

Refer now to FIG. 3 where the helium conduit 64 including the RF shield 230 and the flow restrictor described below according to the present invention is depicted. A curved portion 208 of the helium conduit 64 is located between a straight portion 210 which extends downwardly from the base 44 (see FIGS. 2A and 2B) and the RF junction 212. As depicted in FIG. 2A, the RF junction 212 is located above the curved portion 208 whereas in FIG. 3 alternatively, the RF junction 212 is located in a horizontal position curve portion 208. As depicted in FIG. 3, extending horizontally from the RF hot portion 212 is the straight portion 214 which extends to the helium source 62 (see FIG. 1). An exposed portion 216 of the straight portion 214 is positioned between an RF shield 230 and the RF hot portion 212. The RF shield 230 is radially spaced outwardly from the straight portion 214 of the helium conduit 64. The RF shield 230 has a larger inner diameter than the outer diameter of the straight portion 214 and can touch the portion 214. The RF shield 230 must be RF grounded. The RF shield 230 includes a straight portion 232 and at least one corona ring 234 at an end thereof. The RF shield 230 is supported on the end opposite the corona ring 234. Optionally, a second corona ring, shown as reference number 236 can be positioned at opposite end of the straight portion 232 if the RF shield 230 is supported at an intermediate portion thereof. The RF shield 230 is made from brass and has a skin thickness sufficient to prevent the RF field from penetrating the RF shield due to the phenomenon known as skin effect.

Skin effect is the tendency for an alternating current to concentrate near the outer part or "skin" of a conductor. For a steady unidirectional current through a homogeneous conductor, the current distribution is uniform over the cross section. That is, the current density is the same at all points in the cross section. With an alternating current, the current is displaced more and more to the surface as the frequency increases. The conductor's effective cross section is therefore reduced so the resistance and energy dissipation are increased compared with the values for a uniformly distributed current. The effective resistance of a wire rises significantly with frequency. For example, for a copper wire of 1-mm (0.04-in.) diameter, the resistance at a frequency of 1 MHz is almost four times the DC value.

A mathematical description of skin effect can be derived from Maxwell's equations, but exact solutions have been obtained for only several simple shapes, including cylindrical, tubular and flat conductors. For a plane conductor carrying a sinusoidal alternating current, the current density is a maximum at the surface and its magnitude decreases exponentially with distance into the conductor. A skin depth or penetration depth δ is frequently used in assessing the results of skin effect. It is the depth below the conductor surface at which the current density has decreased to 1/e (approximately 37%) of its value at the surface and is given by $\sqrt{1/(\pi f \mu \sigma)}$, where $f$ is the frequency and $\sigma$ and $\mu$ are the conductivity and permeability of the material respectively. This concept applies strictly only to plane solids, but can be extended to other shapes provided the radius of curvature of the conductor surface is appreciably greater than δ.

The main purpose of the corona rings 234, 236 is to reduce voltage stress and the voltage gradient which can possibly develop at sharp points of the RF shield 230. The corona ring 234 extends radially outwardly from the straight portion 232 and have rounded outer diameter without sharp edges. By reducing the voltage gradient, the possibility of plasma lighting and arcing is greatly reduced. The RF shield 230 prevents dielectric heating of the helium conduit 216. Dielectric heating is the heating of the electrically non-conductive material of the helium tube 64 by a rapidly varying electric field.

Positioned within the exposed portion 216 of the gas line 64 is a flow restrictor 400, 450 (see FIGS. 4A and 4B). As depicted in FIGS. 4A and 4B, two variations of a flow restrictor 400, 450 are illustrated. In either the FIG. 4A or 4B embodiment, the combined length of the flow restrictor 400, 450 would be such that it would extend on one end from the RF junction 212 and overlap longitudinally with the RF shield 230 by approximately three quarters of an inch (see FIG. 4C). Thus, as depicted in FIG. 3 the flow restrictor would be positioned within the inside diameter of the straight portion 214.

As depicted in FIG. 4A, the flow restrictor 400 includes three stacked inserts 402, 404, 406 each having the same outer and inner diameter. Insert 404 is in between 402 and 406. Each insert 402, 404, 406 has a cylindrical step 410 on opposite ends thereof. Each step 410 has a smaller diameter than the insert 402, 404, 406 and which extends outwardly beyond end surfaces 420. As depicted in FIG. 4B, the flow restrictor 450 includes three inserts 452, 454, 456. Insert 454 is in between inserts 452 and 456. Any of the inserts can be made from an electrically non-conductive material such as Teflon™, quartz or ceramic. As depicted in FIG. 4B, each of the inserts 452, 454, 456 has, in addition to the central cylindrical step 410, a plurality of circumferentially spaced through holes 460 located radially outwardly from the central through hole 410. The holes 460 do not have to be aligned from one insert to another to provide a gas flow path. Instead, the steps 410 form a gap 430 between insert surfaces 420 to provide a gas flow paths between holes 460 in adjacent inserts (see FIGS. 5A–5C). Additionally, a plurality of circumferentially spaced slots 470 having semi-circular configuration are located on the outside diameter of each of the inserts 452, 454, 456. These slots 470 do not have to be aligned to provide a gas flow path. The gap 430 provides a flow path between slots 470 in adjacent inserts.

As depicted in FIG. 4C, in curved portion 208, there is a bendable flow restrictor which is preferably insulated wool 211 (see FIG. 4C) used to reduce the gas flow path feature size or feature dimension. The feature size or dimension is related to the geometry of the flow path which includes, for example, the diameter and length of the gas flow path. The reduced feature size or feature dimension advantageously eliminates plasma lighting in bent or curved portions of the gas line. The insulated wool 211 is sufficiently dense to provide a flow restrictor and thereby reduce flow path diameter and reduce or eliminate the possibility of plasma lighting in the curved portion 208. As depicted in FIG. 4C, the RF junction 212 provides o-ring seals to seal the dissimilar materials of the portion 210 and the straight portion 216 to the RF junction 212.

In either insert embodiment, advantageously, the breakdown voltage of the gas flowing within the gas conduit is higher than it would otherwise be without the insert because the breakdown voltage is inversely proportional to the diameter of the gas flow path of the gas conduit 64. Thus, for a small diameter gas path, the voltage is high whereas for a large diameter gas path the breakdown voltage is low. This is known as Patchen's relationship. Advantageously, plasma lighting can be reduced or eliminated in unshielded portions of the gas line by reducing the gas flow diameter.

Figure 5A:
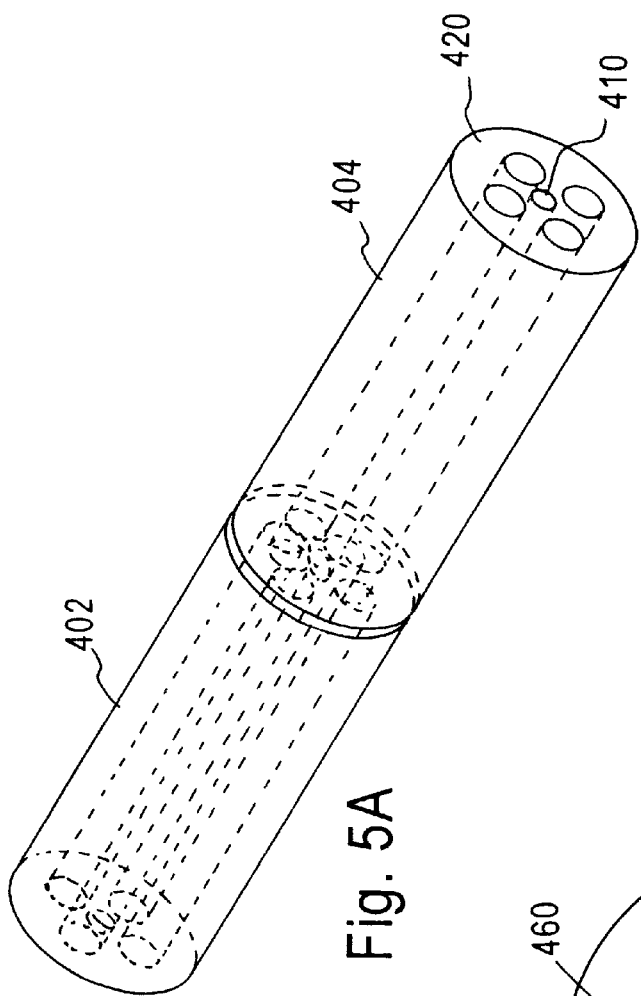
FIG. 5A is a perspective view with dashed lines indicating the flow paths according to the present invention.
Figure 5B:
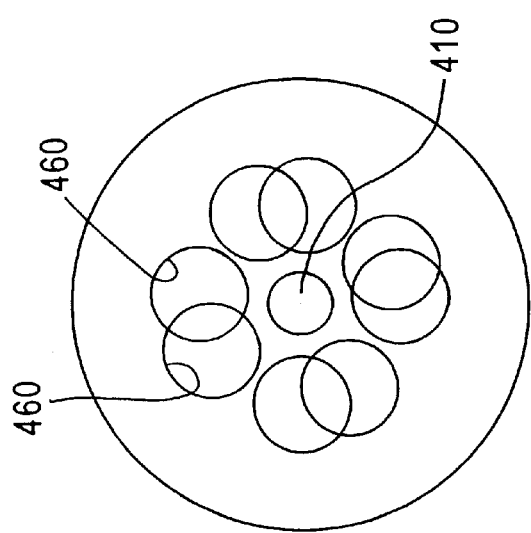
FIG. 5B is a plan view illustrating non-alignment of the flow paths in the inserts.
Figure 5C:
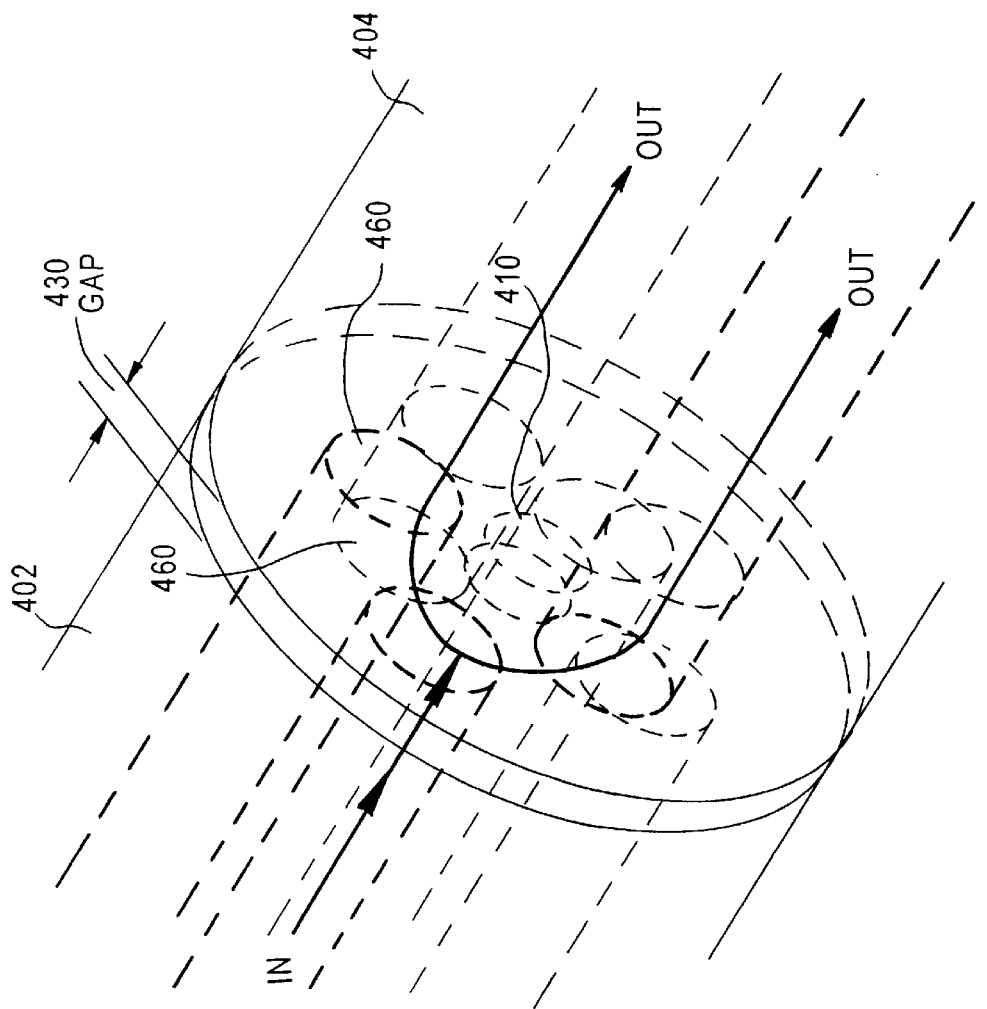
FIG. 5C is an illustration of gas flow through the flow restrictor inserts.

In FIG. 5A, two inserts 402, 404 are depicted with the holes 460 not in alignment. FIG. 5B better illustrates that the holes 460 are misaligned. FIG. 5C is an illustration showing the gas path from holes 460 in insert 402 to other holes 460 in insert 404.

It should now be apparent that an apparatus to reduce or eliminate plasma lighting in a strong RF field has been described. The present invention uses RF shielding and gas flow restricting to reduce or eliminate plasma lighting in a gas line used to cool the work piece in the plasma processor.

It will be readily seen by one of ordinary skill in the art that the present invention achieves all of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

What is claimed is:

1. A vacuum processor for processing a work piece, comprising:
    a vacuum plasma processing chamber;
    a coil responsive to an RF source for exciting the gas to a plasma capable of processing the plasma on a holder;
    a helium tube connected to said chamber;
    an RF shield surrounding a portion of said helium tube;
    a flow restrictor inside an unshielded portion of said helium tube.

2. The vacuum processor of claim 1, further comprising a corona ring attached to said RF shield.

3. The vacuum processor of claim 1, wherein said RF shield is brass.

4. The vacuum processor of claim 1, wherein a portion of said helium tube is RF hot.

5. The vacuum processor of claim 1, wherein said RF shield has a wall thickness thicker than the skin depth.

6. The vacuum processor of claim 1, wherein said RF shield and said flow restrictor overlap is longitudinal.

7. The vacuum processor of claim 1, wherein said RF shield has rounded edges.

8. The vacuum processor of claim 1, wherein said flow restrictor is made of quartz.

9. The vacuum processor of claim 1, wherein said flow restrictor is made of ceramic.

10. The vacuum processor of claim 1, wherein said flow restrictor is made of Teflon™.

11. The vacuum processor of claim 1, wherein said flow restrictor includes a plurality of orifices.

12. The vacuum processor of claim 1, wherein said RF shield has a high electrical conductivity.

13. The vacuum processor of claim 1, wherein said helium tube has a bent portion and a straight portion and further comprising insulate wool in at least said bent portion.

14. The vacuum processor of claim 13, further comprising a bendable flow restrictor positioned in said bent portion.

15. The vacuum processor of claim 14, wherein said bendable flow restrictor comprises a ceramic insert and insulate wool.

16. The vacuum processor of claim 1, wherein said flow restrictor is formed of multiple inserts having smaller feature sizes.

17. The vacuum processor of claim 16, wherein each of said multiple inserts has a gap formed between adjacent inserts which forms a gas flow path.

18. The vacuum processor of claim 16, wherein each of said flow restrictors has flow paths formed on an outer surface thereof.

19. The vacuum processor of claim 1, wherein said RF shield is radially spaced from said helium tube.

20. The vacuum processor of claim 1, wherein a thickness of said RF shield is greater than a skin depth of the material at a given RF frequency.

* * * * *